United States Patent
Greiner

(10) Patent No.: US 9,230,960 B1
(45) Date of Patent: Jan. 5, 2016

(54) COMBINED TAP CELL AND SPARE CELL FOR LOGIC CIRCUIT

(71) Applicant: Marvell International Ltd., Hamilton (BM)

(72) Inventor: Brandon Greiner, Firestone, CO (US)

(73) Assignee: Marvell International Ltd., Hamilton (BM)

( * ) Notice: Subject to any disclaimer, the term of this patent is extended or adjusted under 35 U.S.C. 154(b) by 440 days.

(21) Appl. No.: 13/752,607

(22) Filed: Jan. 29, 2013

Related U.S. Application Data

(60) Provisional application No. 61/593,984, filed on Feb. 2, 2012.

(51) Int. Cl.
  *H01L 27/10* (2006.01)
  *H01L 27/088* (2006.01)
  *H01L 27/118* (2006.01)

(52) U.S. Cl.
  CPC .......... *H01L 27/088* (2013.01); *H01L 27/11807* (2013.01)

(58) Field of Classification Search
  CPC ................. H01L 27/118; H01L 27/11807
  USPC .................................................. 257/202–206
  See application file for complete search history.

(56) References Cited

U.S. PATENT DOCUMENTS

2007/0272947 A1* 11/2007 Wu et al. ............. 257/202
2012/0286331 A1* 11/2012 Aton et al. ............. 257/202

* cited by examiner

*Primary Examiner* — Cuong O Nguyen

(57) ABSTRACT

Embodiments of the present disclosure provide an apparatus for providing a combined tap cell and spare cell in a logic design. An integrated circuit contains a plurality of logic cells that are arranged in a series of columns and rows and that include one or more transistors. A first cell includes a logic portion including one or more transistors, and a tap portion. The tap portion provides tap connectivity to the one or more transistors of the subset of the plurality of logic cells, and to the one or more transistors of the logic portion.

20 Claims, 3 Drawing Sheets

COMBINED TAP CELL AND SPARE CELL FOR LOGIC CIRCUIT

CROSS REFERENCE TO RELATED APPLICATIONS

This present disclosure claims priority to U.S. Provisional Patent Application No. 61/593,984, filed on Feb. 2, 2012, which is incorporated herein by reference.

TECHNICAL FIELD

Embodiments of the present disclosure relate to the field of logic circuits, and in particular to design and layout of a logic cell.

BACKGROUND

The background description provided herein is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure.

Integrated circuits (ICs), such as application-specific integrated circuits (ASIC), field-programmable gate arrays (FPGA), or other ICs are often composed of standard cells. The cells (also referred to herein as "logic cells") are standard in the sense that the cells are of standard size(s) and the cells have certain standard logic characteristics. Logic cells may include memory cells, flip flops, or latches, or they may include logic functionality such as NAND and NOR gates. In conventional ICs, the standard cells are arranged in a grid pattern (a series of columns and rows along a plane of the IC with one or more metal layers overlaid on top of the plane to provide electrical connectivity between the logic cells as well as to provide power to the logic cells.

Design for Rule Checking (DRC) design rules include rules related to spacing between two adjacent objects, such as standard cells, in an IC. In one example, a given cell is required by DRC constraints to be no closer than a minimum distance from a voltage rail of the IC. This DRC constraint prevents the voltage rail from interfering with operation of the given cell. An alternative DRC constraint enables a cell to be adjacent to or to overlap with a voltage rail as long as metal portions of the cell are within a certain minimum distance from the voltage rail. In either case, this DRC constraint results in portions of the IC being unusable, and thus wasted space.

Tap cells and spare cells are introduced into the circuit during the design phase. Tap cells provide well tap connectivity and substrate tap connectivity to transistors in logic cells. Well tap connectivity provides positive voltage, for example, to N-type wells of a CMOS transistor, and substrate connectivity provides negative or ground voltage to a substrate region (such as a P-type substrate region) of the transistors. Well taps and substrate taps lower the resistance of the substrate, thereby preventing shorts.

Spare cells include spare logic portions. Early in a design process, inputs of the spare logic cell are typically tied to negative or ground voltage, or in some other known state, and outputs of the spare logic cell are left floating, or left in some other known state. Later in the design process, metal traces may be added to connect the spare logic cell to other cells in the IC in order to fix a bug or flaw. Placing spare cells into the design enables a chip designer to address bugs or flaws in the design more easily than having to add new logic cells to the design to address bugs or flaws at a later stage in the design process.

SUMMARY

In one embodiment, the present disclosure provides an integrated circuit for providing a combined tap cell and spare cell in a logic design. An integrated circuit contains a plurality of logic cells that are arranged in a series of columns and rows and that include one or more transistors. A first cell includes a logic portion, including one or more transistors, and a tap portion. The tap portion provides tap connectivity to the one or more transistors of the subset of the plurality of logic cells, and to the one or more transistors of the logic portion The logic portion of the first cell is a spare logic portion that is logically cut off from the rest of the integrated circuit. A second cell includes a second tap portion that provides voltage tap connectivity to one or more transistors of at least a second subset of the plurality of logic cells, and a second logic portion. The second logic portion includes at least one input coupled to ones of the plurality of logic cells and at least one output coupled to same or different ones of the plurality of logic cells.

The integrated circuit includes a first metal layer disposed above the plurality of logic cells, and a second metal layer disposed above the first metal layer. The second metal layer includes a first power rail that provides a positive voltage and a second power rail that provides a negative or ground voltage. The first power rail is parallel to the second power rail, and the first cell is situated partially below the first power rail and partially below the second power rail.

In another embodiment, the present disclosure provides a semiconductor device with a plurality of cells arranged in a first plane of the semiconductor device. A first cell is situated in the first plane, and the first cell includes a well tap portion that provides well tap connectivity of a voltage source to a shared n-well of a subset of the plurality of cells, and a spare logic portion configured to perform a logic function. The spare logic portion is coupled at least to the voltage source. The semiconductor device includes a metal layer in a second plane of the semiconductor device. The metal layer has a pair of positive and ground power rails. The first cell occupies at least an area of the first plane that is situated below an area of the second plane that is at least partly between the pair of positive and ground power rails.

The semiconductor device further comprises a second metal layer in a third plane of the semiconductor device. The second metal layer has a second pair of positive and ground power rails, and the area of the first plane occupied by the first cell is situated below an area of the third plane that is partly between the second pair of positive and ground power rails.

The spare logic is logically cut off from the plurality of cells, and the semiconductor device further comprises a second cell. The second cell includes a second well tap portion that provides substrate tap connectivity of the voltage source to the shared n-well or to a second shared n-well of a second subset of the plurality of cells, and a logic portion with at least an input coupled to a first one of the plurality of cells and an output coupled to the first one of the plurality of cells or to a second one of the plurality of cells.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

As noted above, conventional ICs include standard cells, such as standard logic and memory cells, whose placement conform to Design for Rule Checking (DRC) constraints. ICs according to embodiments of the present disclosure include cells that have both tap portions and logic portions—such cells are referred to herein as "combination cells". In various embodiments, the combination cells are located at least partially underneath a pair of second metal layer (referred to herein as M2) voltage rails, thereby occupying the space between the rails and adjacent to one or both of the voltage rails, thereby making such space usable. Metal portions, such as pins, that extend into at least some of the metal layers of the IC are kept at least a certain distance from the voltage rails, thereby addressing DRC constraints. Including both tap portions and spare logic portions enables embodiments of the present disclosure to ensure that an IC design has ample spare logic cells, because tap cells will be placed within the IC at regular or semi-regular intervals. Thus, by placing combination cells at those same regular or semi-regular intervals, the IC will have plenty of spare logic cells by virtue of the combination cells including tap cells. Also, combining tap portions with spare logic portions into a single cell (e.g., a single combination cell) enables, such as in those embodiments where tap cells are placed beneath M2 voltage rails, to utilize otherwise unusable space between and/or adjacent to the M2 voltage rails in the IC design.

Figure 1:
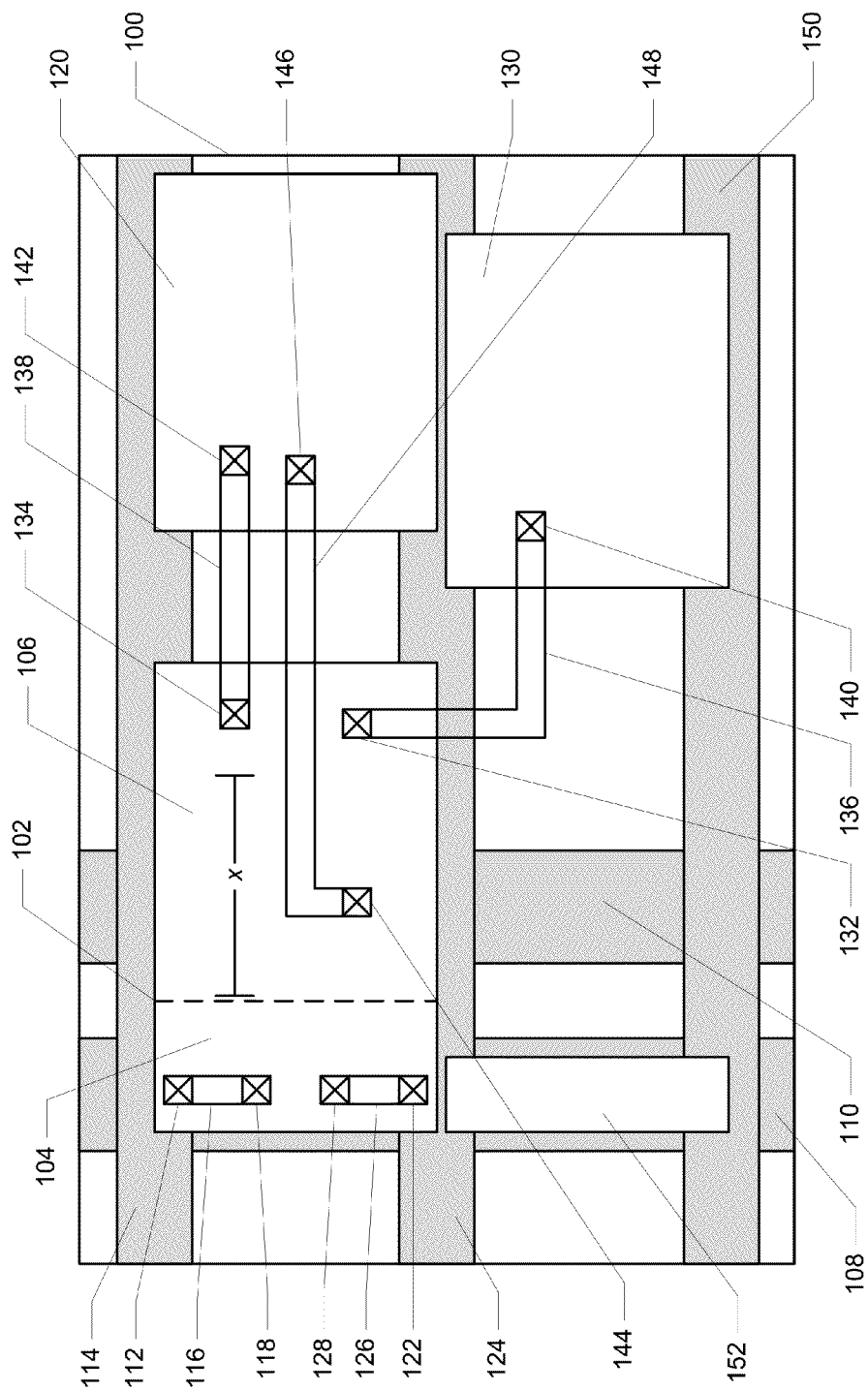
FIG. 1 is a schematic diagram of an example integrated circuit (IC) having a combination cell with both a tap portion and a logic portion.

FIG. 1 is a schematic diagram of an example integrated circuit (IC) 100 having a combination cell 102, in which the combination cell 102 includes both a tap portion 104 and a logic portion 106. Conventional tap cells may be placed beneath a second metal layer (M2) positive voltage rail (e.g., a VDD voltage rail), such as the M2 positive voltage rail 108. Combination cell 102 is also disposed beneath M2 positive voltage rail 108, as well as partially beneath M2 negative or ground voltage rail 110 (e.g., a VSS voltage rail). Combination cell 102 also occupies an area below an area between the M2 positive voltage rail 108 and negative or ground voltage rail 110, as well as an area adjacent to the negative or ground voltage rail 110. In conventional ICs, these areas would be unoccupied, and therefore wasted, due to DRC spacing constraints.

The tap portion 104 includes pin 112 that is connected by via or other electrical connector to a first metal layer (referred to herein as M1) positive voltage rail 114. Pin 112 is electrically coupled by trace 116 to pin 118. Pin 118 is connected by via or other electrical connector to a shared n-well of the transistors in a subset of standard cells of the IC 100. In the example shown in FIG. 1, the n-well can be shared with standard cell 120 as well as other standard cells that are not shown in FIG. 1. Thus, combination cell 102 provides well tap connectivity to at least the standard cell 120.

The tap portion 104 includes pin 122 that is connected by via or other electrical connector to M1 negative or ground power rail 124. The pin 122 is electrically coupled through trace 126 to pin 128. Pin 128 is coupled by via or other electrical connector to a portion of p-doped substrate shared by the subset of the standard cells of the IC 100, such as the standard cell 120. Thus, the combination cell 102 provides substrate tap connectivity to at least standard cell 120.

The logic portion 106 may include various logic features, including transistors arranged in various logic configurations, such as to implement one or more logic functions, such as an inverter, a NOR, a NAND, a flip-flop, a memory cell, a latch, and so forth. The inputs of logic portion 106 may be, in at least an initial design of a logic circuit implemented by IC 100, coupled to a ground or negative voltage, and the output of logic portion 106 is in at least the initial design floating, thereby logically cutting off the logic portion from the rest of the IC 100, such as by tying off the inputs of the transistors in the logic portion 106 to some known state, including one or more of attaching inputs and/or outputs of the logic portion 106 to ground or other voltage, leaving one or more of the inputs and/or outputs of the logic portion 106 floating, cutting the logic portion 106 off logically from the rest of the IC 100 with a decoupling capacitor, leaving a polysilicon gate in the logic portion 106 in a floating configuration, or logically separating the logic portion 106 from the rest of the IC 100 with a polysilicon fill. Where the logic portion 106 remains uncoupled to other logic cells of the IC 100, the logic portion 106 of the combination cell 102 in IC 100 is an unused spare logic cell.

The logic portion 106 and the tap portion 104 are shown as being physically distinct from one another within the combination cell 102. But in various embodiments, the logic portion and the tap portion are not neatly divided as shown in FIG. 1, and their various components may occupy any portion of the combination cell 102. In certain embodiments, one or more of the logic portion may be beneath M2 positive voltage rail 108, M2 negative or ground voltage rail 110, or the area between the M2 positive voltage rail 108 and the M2 negative or ground voltage rail 110. The transistors of the logic portion 106 share the same n-well and substrate portions as do the subset of the standard cells of the IC 100. The tap portion 104 therefore also provides tap connectivity to the transistors of the logic portion 106, as well as to the subset of the standard cells.

In various embodiments, the combination cell 102 is utilized to perform the desired logic circuit of the IC 100 and is therefore coupled to other logic cells, such as the standard cell 120 and a standard cell 130. This may occur, for example, where a spare logic function is needed to correct a bug or flaw, or to implement another change to the logic circuit implemented by IC 100 that occurs later on in the design process. For example, logic portion 106 includes pins 132 and 134, which may be coupled by traces 136 and 138, respectively, to pins 140 and 142 of the standard cells 130 and 120, respectively. Pins 132 and 134 are situated at least a certain distance x from M2 negative or ground voltage rail 110, in order to meet DRC constraints on the design of the IC 100. This may be because, for example, traces 136 and 138 are disposed within second metal layer M2, and the M2 negative or positive voltage rail 110 may provide unacceptable levels of noise or interference with the traces 136 and 138 were the pins 132 and 134 placed too close to the M2 negative or ground voltage rail 110.

Not all pins within the combination cell 102 are spaced at distance x away from the M2 voltage rails 108 and 110. For example, pin 144 is situated directly beneath the M2 negative or ground voltage rail 110. Pin 144 is coupled to pin 146 by a trace 148, which may be disposed in the first metal layer M1, and therefore is not likely to interfere with, or suffer interference caused by, the M2 negative or ground voltage rail 110.

Standard cell 130 is shown situated between M1 negative or ground voltage rail 124 and M1 positive voltage rail 150, which may be provided with tap connectivity by another combination cell having a tap portion and a logic portion, or by a tap cell 152, which does not have a logic portion.

Because of the DRC constraint to maintain at least a distance x between (i) the M2 negative or ground voltage rail 110 and (ii) the metal portions of the combination cell 102 that are coupled to the second metal layer M2, there may be limited space in the combination cell 102 to provide pins or other M2-coupled metal portions within the combination cell 102. Thus, a double-sized combination cell may be utilized, as is illustrated in FIG. 2

Figure 2:
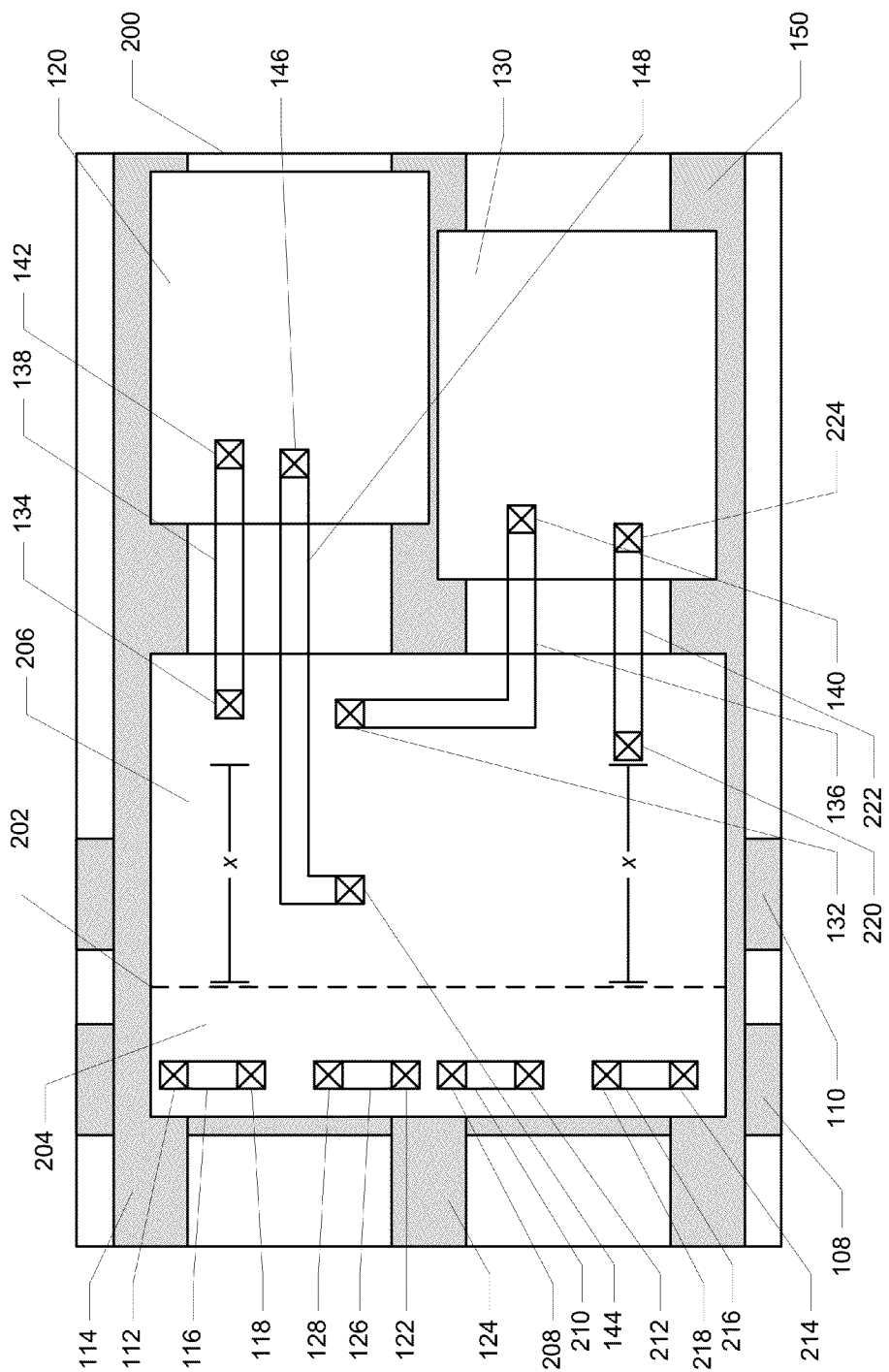
FIG. 2 is a schematic diagram of an example IC having a double-sized combination cell.

FIG. 2 is a schematic diagram of an example IC 200 having a double-sized combination cell 202. Combination cell 202 includes tap portion 204 and logic portion 206. The tap portion 204 provides tap connectivity to a subset of the standard cells of the IC 200, including the standard cell 120 and to the standard cell 130. For example, pin 208 is electrically coupled by a via or other electrical connector to the M1 negative or ground power rail 124, and also electrically coupled by trace 210 to a pin 212, which is coupled by a via or other electrical connector to a p-doped portion of the substrate shared by the standard cell 130, thereby providing substrate tap connectivity to the standard cell 130. The pin 214 is electrically coupled by a via or other electrical connector to the M1 positive power rail 150, and also electrically coupled by trace 216 to a pin 218, which is coupled by a via or other electrical connector to an n-well shared by the standard cell 130, thereby providing substrate tap connectivity to the standard cell 130.

Pin 220 is electrically coupled by trace 222 to pin 224 of standard cell 330. As noted above, in the combination cell 102 of FIG. 1, there is limited area in which to put metal features, such as pins, that are coupled to the M2 layer while maintaining those metal features at least at a distance x from the m2 negative or ground voltage rail 110. By utilizing a double-sized combination cell, such as combination cell 202, extra area is available to incorporate metal features, such as pin 220, within the combination cell 202.

Figure 3:
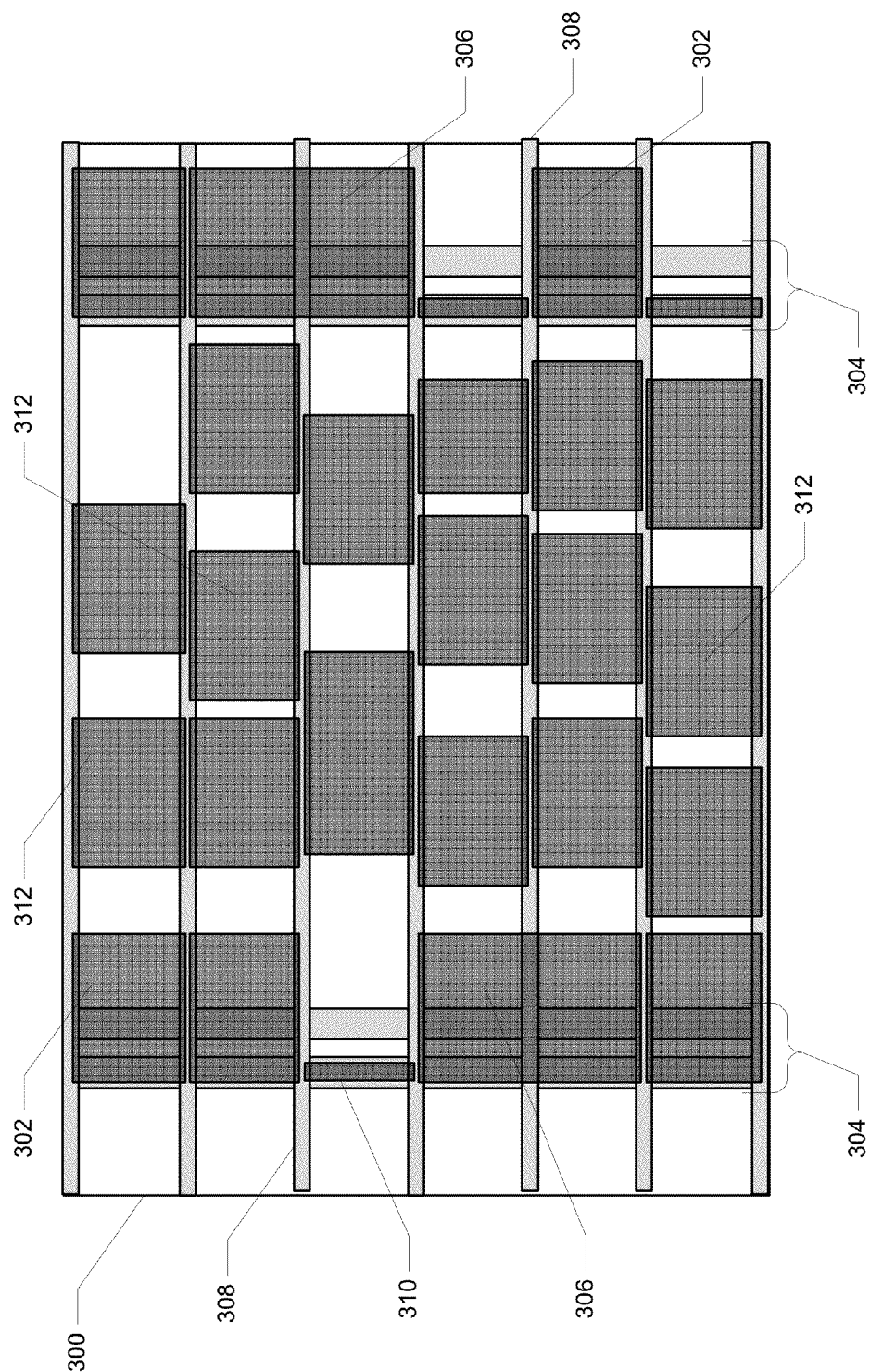
FIG. 3 is a schematic diagram of an example IC having combination cells that are spaced apart are regular intervals.

FIG. 3 is a schematic diagram of an example IC 300 having combination cells 302 that are spaced apart at regular intervals. The combination cells 302 are arranged in a plane of the IC 300, and are situated under pairs of M2 voltage rails 304, thereby occupying area underneath and/or adjacent to a pair of M2 voltage rails 304 that would otherwise, in conventional ICs, be unoccupied due to DRC constraints as are described above. Double-sized combination cells 306 are similarly arranged in a plane of the IC 300, and are situated under pairs of M2 voltage rails 304. The pairs of M2 voltage rails 304 may be the same as or similar to the voltage rails 108 and 110 of FIGS. 1 and 2. And the M1 voltage rails 308 may be the same as or similar to the voltage rails 114, 124, and 150 of FIGS. 1 and 2.

The combination cells 302 are the same as or similar to the combination cell 102 of FIG. 1, and include tap portions and logic portions that are the same as or similar to the tap portion 104 and the logic portion 106, respectively, of FIG. 1. The double-sized combination cells 306 are the same as or similar to the combination cell 202, and include tap portions and logic portions that are the same as or similar to the tap portion 204 and the logic portion 206, respectively, of FIG. 2.

IC 300 may also include tap cells 310, which do not have a logic portion. Combination cells 302 and 306, along with tap cells 310, may provide well and/or substrate tap connectivity to subsets of standard cells 312 of IC 300.

Although IC 300 is shown with a combination of differently sized combination cells 302 and 306, as well as tap cells 310, various embodiments of the present disclosure include ICs with only one size of combination cells. Various embodiments may also not include tap cells 310.

Also, although the combination cells 102, 202, 302, and 306 have been referred to herein as having spare logic portions, in various embodiments the logic portions of these combination cells are not used as spare logic portions, either in the final design of the IC or in initial or intermediate designs. In other words, although these logic portions may have originally been designed to be "spare" logic portions, in the final design they may not be used as spare logic portions, and may thus have their inputs and outputs coupled to other logic cells, such as standard cells 312, or to input/output circuitry of the IC. Also, the logic portions of one or more of the combination cells 102, 202, and/or 302 of the present disclosure may have been initially designed to be non-spare logic portions. In other words, these logic portions may have been intended to be incorporated into the logic design of the IC in an initial design. In any event, embodiments of the present disclosure include ICs that have combination cells with "spare" logic portions—in the sense that their logic portions are not coupled to other cells or to input/output circuitry of the IC—as well as logic portions that are not "spare" logic portions (whether by initial or final design), and thus have their inputs and outputs coupled to other logic cells or to input/output circuitry of the IC.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An integrated circuit, comprising:
   a plurality of logic cells arranged in the integrated circuit, wherein at least a subset of the plurality of logic cells includes one or more transistors; and
   a first cell, wherein the first cell includes
   (i) a logic portion including one or more transistors, and
   (ii) a tap portion, wherein the tap portion provides tap connectivity to (i) the one or more transistors of the subset of the plurality of logic cells and (ii) the one or more transistors of the logic portion.

2. The integrated circuit of claim 1, wherein the logic portion is a spare logic portion that is logically cut off from the rest of the integrated circuit.

3. The integrated circuit of claim 2, wherein the tap portion is a first tap portion, and wherein the integrated circuit further comprises a second cell, the second cell including:
   (i) a second tap portion that provides voltage tap connectivity to one or more transistors of at least a second subset of the plurality of logic cells; and
   (ii) a second logic portion, wherein the second logic portion includes (i) at least one input coupled to ones of the plurality of logic cells and (ii) at least one output coupled to same or different ones of the plurality of logic cells.

4. The integrated circuit of claim 1, wherein the logic portion includes (i) at least one input coupled to ones of the plurality of logic cells and (ii) at least one output coupled to same or different ones of the plurality of logic cells.

5. The integrated circuit of claim 1, wherein:
   the integrated circuit includes (i) a first metal layer disposed above the plurality of logic cells, and (ii) a second metal layer disposed above the first metal layer;
   the second metal layer includes (i) a first power rail that provides a positive voltage and (ii) a second power rail that provides a negative or ground voltage;
   the first power rail is parallel to the second power rail; and
   the first cell is situated partially below the first power rail and partially below the second power rail.

6. The integrated circuit of claim 5, wherein the tap portion includes (i) a first via that taps into a positive power rail of the first metal layer, and (ii) a second via that taps into a n-well portion of a substrate of the integrated circuit, wherein the n-well portion of the substrate is shared by the subset of the plurality of logic cells, to provide well tap connectivity to the subset of the plurality of logic cells.

7. The integrated circuit of claim 5, wherein the tap portion includes (i) a first via that taps into a negative or ground power rail of the first metal layer, and (ii) a second via that taps into a substrate portion of the integrated circuit, wherein the substrate portion is shared by the subset of the plurality of logic cells, to provide substrate tap connectivity to the subset of the plurality of logic cells.

8. The integrated circuit of claim 5, wherein the first cell includes pin connections to the second metal layer, wherein all pin connections to the second metal layer are located at least a certain distance away from the first and second power rails.

9. The integrated circuit of claim 5, wherein the first cell includes a pin connection to the first metal layer located below the first or second power rails.

10. The integrated circuit of claim 1, wherein at least one of the logic cells includes a memory cell, latch, or flip-flop.

11. The integrated circuit of claim 1, wherein at least one of the logic cells includes a configurable logic cell.

12. The integrated circuit of claim 1, wherein at least one of the logic cells includes a NOR gate or a NAND gate.

13. The integrated circuit of claim 1, wherein:
   the integrated circuit includes (i) a first metal layer disposed above the plurality of logic cells, and (ii) a second metal layer disposed above the first metal layer,
   the first metal layer includes (i) a first power rail that provides a positive voltage, (ii) a second power rail that provides a negative or ground voltage, and (iii) a third power rail that provides the positive voltage,
   the first, second, and third power rails are parallel and situated within the first metal layer with the second power rail between the first and third power rails,
   the first cell occupies an area beneath the first metal layer, and
   the area is partially below both the first and third power rails.

14. The integrated circuit of claim 1, wherein:
   the integrated circuit includes (i) a first metal layer disposed above the plurality of logic cells, and (ii) a second metal layer disposed above the first metal layer,
   the first metal layer includes (i) a first power rail that provides a positive voltage, (ii) a second power rail that provides a negative or ground voltage, and (iii) a third power rail that provides the positive voltage,
   the first, second, and third power rails are parallel and situated within the first metal layer with the second power rail between the first and third power rails,
   the first cell occupies an area beneath the first metal layer, and
   the area is partially below both the first and second power rails.

15. A semiconductor device, comprising:
   a plurality of cells arranged in a first plane of the semiconductor device;
   a first cell situated in the first plane, the first cell including
      (i) a well tap portion providing well tap connectivity of a voltage source to a shared n-well of a subset of the plurality of cells, and
      (ii) a spare logic portion configured to perform a logic function, wherein the spare logic portion is coupled at least to the voltage source; and
   a metal layer in a second plane of the semiconductor device, the metal layer having a pair of positive and ground power rails,
   wherein the first cell occupies at least an area of the first plane that is situated below an area of the second plane that is at least partly between the pair of positive and ground power rails.

16. The semiconductor device of claim 15, wherein the metal layer is a first metal layer and the pair of positive and ground power rails is a first pair of positive and ground power rails, and wherein:
   the semiconductor device further comprises a second metal layer in a third plane of the semiconductor device, the second metal layer having a second pair of positive and ground power rails; and
   the area of the first plane occupied by the first cell is situated below an area of the third plane that is partly between the second pair of positive and ground power rails.

17. The semiconductor device of claim 15, wherein the pair of positive and ground power rails includes a ground power rail and a first positive power rail, and wherein the metal layer includes a second positive power rail parallel to both the ground power rail and the first positive power rail, with the ground power rail situated between the first and second positive power rails, and wherein:
   the area of the second plane, which is above the area of the first plane occupied by the first cell, is at least partly between the first and second positive power rails of the second plane.

18. The semiconductor device of claim 15, wherein the spare logic is logically cut off from the plurality of cells.

19. The semiconductor device of claim 18, wherein the well tap portion is a first well tap portion, the shared n-well is a first shared n-well, the subset of the plurality of cells is a first subset of the plurality of cells, and wherein the semiconductor device further comprises a second cell, the second cell having:
   a second well tap portion providing substrate tap connectivity of the voltage source to the shared n-well or to a second shared n-well of a second subset of the plurality of cells; and a logic portion with at least an input coupled to a first one of the plurality of cells and an output coupled to the first one of the plurality of cells or to a second one of the plurality of cells.

20. The semiconductor device of claim 15, wherein the spare logic portion includes one of a memory cell, a NOR gate, a NAND gate, or an inverter.

* * * * *